United States Patent
Teng

(10) Patent No.: US 6,656,331 B2
(45) Date of Patent: Dec. 2, 2003

(54) APPLICATION OF ANTISTATIC/ANTIREFLECTIVE COATING TO A VIDEO DISPLAY SCREEN

(75) Inventor: Yueh-Ming Teng, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 10/135,215

(22) Filed: Apr. 30, 2002

(65) Prior Publication Data

US 2003/0201163 A1 Oct. 30, 2003

(51) Int. Cl.$^7$ .............. C23C 14/34; H01J 9/12; H01J 9/38

(52) U.S. Cl. .............. 204/192.12; 204/298.11; 445/36; 445/38

(58) Field of Search .............. 204/192.12, 298.11; 445/36, 38

(56) References Cited

U.S. PATENT DOCUMENTS

| | | | |
|---|---|---|---|
| 2,522,531 A | 9/1950 | Mochel | 117/54 |
| 2,564,677 A | 8/1951 | Davis | 201/73 |
| 2,564,707 A | 8/1951 | Mochel | 117/54 |
| 2,564,709 A | 8/1951 | Mochel | 201/73 |
| 2,564,710 A | 8/1951 | Mochel | 201/73 |
| 2,612,611 A | 9/1952 | Szegho et al. | 250/80 |
| 2,680,205 A | 6/1954 | Burton | 313/92 |
| 2,734,142 A | 2/1956 | Barnes | 313/92 |
| 2,808,351 A | 10/1957 | Colbert et al. | 117/211 |
| 2,833,902 A | 5/1958 | Gaiser et al. | 201/73 |
| 2,852,415 A | 9/1958 | Colbert et al. | 117/211 |
| 2,919,212 A | 12/1959 | Gaiser | 117/215 |
| 2,977,412 A | 3/1961 | Rhodes et al. | 178/7.85 |
| 3,093,598 A | 6/1963 | McMillan et al. | 252/521 |
| 3,252,829 A | 5/1966 | Romstadt et al. | 117/211 |
| 3,689,312 A | 9/1972 | Long, III et al. | 117/94 |
| 3,738,732 A | 6/1973 | Ikenda | 117/33.3 |
| 4,263,335 A | 4/1981 | Wagner et al. | 427/29 |
| 4,393,095 A | 7/1983 | Greenberg | 427/87 |
| 4,463,114 A | 7/1984 | Balchunis et al. | 524/157 |
| 4,468,702 A | 8/1984 | Jandrell | 358/245 |
| 4,490,227 A | 12/1984 | Bitter | 204/192 |
| 4,563,612 A | 1/1986 | Deal et al. | 313/478 |
| 4,649,126 A | 3/1987 | Gaprindashvili et al. | 501/43 |
| 4,650,557 A | 3/1987 | Bitter | 204/192.12 |
| 4,695,045 A | 9/1987 | Chase et al. | 269/152 |
| 4,720,282 A | 1/1988 | Chase et al. | 445/52 |
| 4,785,217 A | 11/1988 | Matsuda et al. | 313/479 |
| 4,857,361 A | 8/1989 | Bloss et al. | 427/109 |
| 4,884,006 A | 11/1989 | Prazak, III | 313/474 |
| 4,885,501 A | 12/1989 | Tong | 313/402 |
| 4,930,015 A | 5/1990 | Dougherty et al. | 358/246 |
| 4,945,282 A | 7/1990 | Kawamura et al. | 313/479 |
| 4,958,148 A | 9/1990 | Olson | 340/712 |
| 4,987,338 A | 1/1991 | Itom et al. | 313/478 |

(List continued on next page.)

FOREIGN PATENT DOCUMENTS

| | | | | |
|---|---|---|---|---|
| EP | 0 585 819 A1 | 8/1993 | | H01N/29/86 |
| EP | 708063 A1 * | 4/1996 | | C03C/17/34 |

Primary Examiner—Steven H. VerSteeg
(74) Attorney, Agent, or Firm—Emrich & Dithmar

(57) ABSTRACT

An antistatic/antireflective coating is applied by sputtering to the outer surface of a video display screen such as in a cathode ray tube (CRT) and is comprised of an inner antistatic layer and an outer antireflective layer. The inner antistatic layer is conductive, while the outer antireflective layer is insulative. The inner antistatic layer is deposited on the entire outer surface of the display screen, while a portion of the antistatic layer is masked during deposition of the outer antireflective layer leaving a portion, or portions, of the inner antistatic layer exposed. The exposed portion, or portions, of the antistatic layer is then electrically coupled to the CRT's grounded implosion protection, or tension, band for safely directing electrostatic charge on the display screen to neutral ground.

8 Claims, 4 Drawing Sheets

U.S. PATENT DOCUMENTS

| | | | |
|---|---|---|---|
| 5,011,443 A | 4/1991 | Park | 445/2 |
| 5,025,490 A | 6/1991 | Tamura | 313/479 |
| 5,051,652 A | 9/1991 | Isomura et al. | 313/479 |
| 5,099,171 A | 3/1992 | Daiku et al. | 313/479 |
| 5,122,709 A | 6/1992 | Kawamura et al. | 313/479 |
| 5,150,004 A | 9/1992 | Tong et al. | 313/479 |
| 5,189,337 A | 2/1993 | Endo et al. | 313/479 |
| 5,200,667 A | 4/1993 | Iwasaki et al. | 313/478 |
| 5,204,177 A | 4/1993 | Sato et al. | 428/328 |
| 5,241,097 A | 8/1993 | Zupancic et al. | 556/460 |
| 5,254,904 A | 10/1993 | Van De Leest et al. | 313/479 |
| 5,279,851 A | 1/1994 | Minosou et al. | 427/126.2 |
| 5,291,097 A | 3/1994 | Kawamura et al. | 313/478 |
| 5,322,540 A | 6/1994 | Jacquet et al. | 65/60.2 |
| 5,370,981 A | 12/1994 | Krafft et al. | 430/529 |
| 5,372,924 A | 12/1994 | Quintens et al. | 430/527 |
| 5,376,308 A | 12/1994 | Hirai et al. | 252/518 |
| 5,378,404 A | 1/1995 | Han et al. | 252/500 |
| 5,382,383 A | 1/1995 | Hirai et al. | 252/501.1 |
| 5,387,433 A | 2/1995 | Balian et al. | 427/126.3 |
| 5,404,073 A | 4/1995 | Tong et al. | 313/479 |
| 5,412,279 A | 5/1995 | De Boer | 313/479 |
| 5,427,818 A | 6/1995 | Tong et al. | 427/68 |
| 5,443,944 A | 8/1995 | Krafft et al. | 430/529 |
| 5,489,369 A * | 2/1996 | Bjornard et al. | 204/298.25 |
| 5,492,762 A | 2/1996 | Hirai et al. | 428/447 |
| 5,523,114 A | 6/1996 | Tong et al. | 427/68 |
| 5,523,649 A | 6/1996 | Tong et al. | 313/479 |
| 5,536,580 A | 7/1996 | Ikadai et al. | 428/428 |
| 5,572,086 A | 11/1996 | Tong et al. | 313/478 |
| 5,580,662 A | 12/1996 | Tong et al. | 428/432 |
| 5,582,919 A | 12/1996 | Ikadai et al. | 428/428 |
| 5,652,477 A | 7/1997 | Tong et al. | 313/479 |
| 5,691,044 A | 11/1997 | Oyama et al. | 428/216 |
| 5,773,150 A | 6/1998 | Tong et al. | 428/429 |
| 5,783,049 A | 7/1998 | Bright et al. | 204/192.14 |
| 6,313,577 B1 | 11/2001 | Kunisada et al. | 313/479 |
| 6,325,901 B1 * | 12/2001 | Hirayama et al. | 204/192.22 |
| 6,419,803 B1 * | 7/2002 | Baldwin et al. | 204/192.13 |
| 2003/0030910 A1 * | 2/2003 | Teng | 359/586 |
| 2003/0090195 A1 * | 5/2003 | Teng | 313/479 |

* cited by examiner

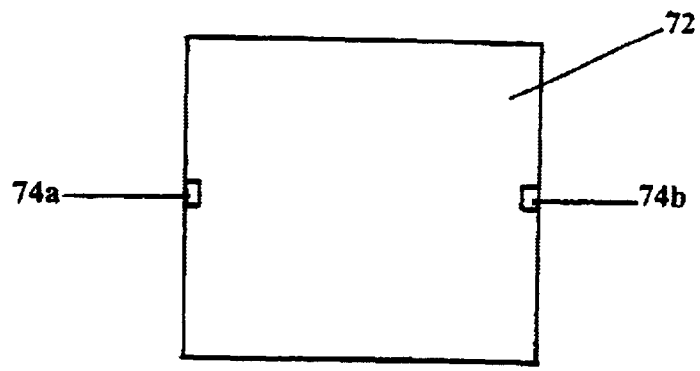
FIG. 7
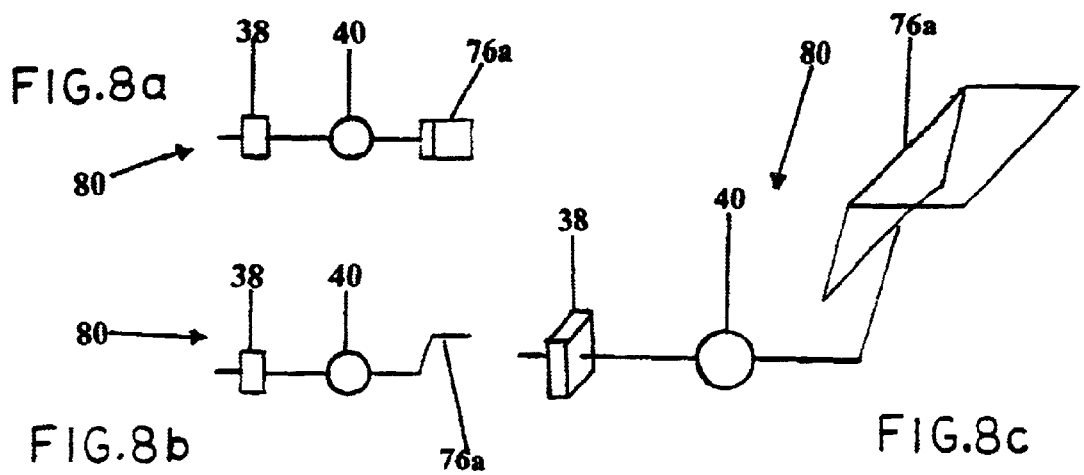
FIG. 8a
FIG. 8b
FIG. 8c

APPLICATION OF ANTISTATIC/ANTIREFLECTIVE COATING TO A VIDEO DISPLAY SCREEN

FIELD OF THE INVENTION

This invention relates generally to video display devices of the self-emitting type such as cathode ray tubes (CRTs) and is particularly directed to a method and apparatus for applying an antistatic/antireflective surface coating to the display screen of a CRT.

BACKGROUND OF THE INVENTION

In a typical CRT, approximately 4–8% of the light incident on the CRT's glass display screen is reflected. This reflected light not only degrades the resolution and contrast of the video image presented on the display screen, but also may cause eye fatigue and in some cases eye damage to the viewer. In addition, the high voltage, e.g., on the order of 25 KeV, typically generated in the CRT results in the buildup of electrostatic charge on the display screen. Dust tends to collect on the outer surface of the display screen because of the presence of this electrostatic charge, resulting in degradation of the video image. In addition, this electrostatic charge buildup may cause an electrical shock to the viewer, particularly in low relative humidity conditions.

In addressing the aforementioned problems, the outer surface of the CRT's display screen is typically provided with a coating having antistatic, antiglare and antireflective characteristics. One approach to applying an antistatic/antireflective coating to the display screen's outer surface employs a "wet" process known as spin or spray coating. Shown in FIG. 1 is a partial sectional view of a sealed glass envelope 10 of a CRT including a glass display screen 12 having disposed thereon a composite antistatic/antireflective coating 14 such as applied by one of the aforementioned wet coating processes. In FIG. 1 and the remaining figures shown and discussed below, common identifying numbers are used to identify the same element appearing in more than one figure. The composite antistatic/antireflective coating 14 applied to the outer surface of the glass display screen 12 is in the form of a single layer comprised of staggered molecules 16 dispersed within an insulating $SiO_2$ layer 18. The inter-molecular spacing is relatively large and there is diffusion between the antistatic and antireflective layers so as to form a single conductive coating having a surface resistance on the order of $10^4$–$10^5$ ohm/cm$^2$. The composite antistatic/antireflective coating 14 is grounded by electrically coupling the antistatic/antireflective coating to the CRT's grounded conductive implosion protection, or tension, band 20 by means of a conductive Al tape layer 22. A plastic film of a conductive Al foil 24 is then placed over the conductive Al tape layer 22 to provide physical protection and electrical insulation for the conductive Al tape layer. Because the composite antistatic/antireflective coating 14 is a good electrical conductor, electrostatic charge on the outer surface of the glass display screen 12 is effectively directed to neutral ground via the conductive Al tape layer 22 and the implosion protection band 20.

An antistatic/antireflective coating may also be applied to the glass display screen's outer surface by a "dry" deposition process such as by sputtering. A sputtered antistatic/antireflective coating differs in several characteristics from an antistatic/antireflective coating deposited by spray or spin coating. For example, as shown in FIG. 2, an antistatic/antireflective coating 32 deposited by sputtering is comprised of an inner antistatic layer 26 and an outer antireflective layer 28. The reason for this difference is that in the sputter-deposited coating, the individual atoms are arranged in a staggered array, rather than the molecules as in the spray or spin-deposited coating, producing a far more compact structure. The inner antistatic layer 26 deposited directly on the outer surface of the glass display screen 22 is highly conductive, while the outer antireflective layer 28 is an insulator. Each of the layers in the sputter-deposited antistatic/antireflective coating 32 is clearly distinguishable from the other layer in the coating and the two layers have fundamentally different characteristics. Indium-doped tin oxide (ITO) is a typical composition for the inner conductive antistatic layer 26, while insulating $SiO_2$ is a typical composition for the outer antireflective layer 28. A layer of Ti may also be disposed between the inner antistatic layer 26 and the outer antireflective layer 28. Attempting to use the grounding approach of FIG. 1 in the sputter-deposited, layered antistatic/antireflective coating 32 of FIG. 2 does not provide effective grounding for the CRT's glass display screen 12. For example, placing a conductive adhesive layer 22 such as of Al tape in contact with and between the coating's outer antireflective layer 28 and the CRT's implosion protection band 20 does not provide an effective electrical conducting path for grounding electrostatic charge buildup on the display screen because the outer antireflective layer is not a good electrical conductor. Similarly, positioning a plastic film 24 such as of conductive Al foil 24 on the outer surface of the conductive adhesive layer 22 also does not provide an effective path to neutral ground for an electrostatic charge on the outer surface of the CRT's glass display screen 12.

Referring to FIG. 3, there are shown another arrangement for directing an electrostatic charge on the display screen 12 of a sealed glass envelope 10 of a CRT to neutral ground. In the arrangement shown in FIG. 3, the layered antistatic/antireflective coating 32 is also formed by sputtering and is comprised of an inner antistatic layer 26 and an outer antireflective layer 28. A gap, or opening, has been formed in the outer antireflective layer 28 adjacent its peripheral edge and extends down to the conductive inner antistatic layer 26. A conductive element 42 is then inserted or formed in the opening in the outer antireflective layer 28 and is positioned in contact with the conductive inner antistatic layer 26. The conductive element 42 is typically comprised of a conductive metal and is formed by conventional means such as ultrasonic spot welding as in the "Sunbonder" technique practiced by Asahi Glass Company of Japan. A conductive Al tape layer 44 is then positioned on the conductive element 42 and extends to the CRT's implosion protection band 20. The conductive element 42 reduces the electrical resistance between the inner antistatic layer 26 and the conductive Al tape layer 44 to provide an effective electrical conductive path to neutral ground via the implosion protection band 20. A plastic film of conductive Al foil 46 is then applied over the conductive Al layer 44 as in the previously described other prior art approaches.

The conductive aluminum tape strip used in the prior art grounding arrangements described above and shown in FIGS. 1–3 is relatively expensive and thus increases the manufacturing cost of the CRT. In addition, the conductive aluminum tape strip is typically applied by hand by a worker which further increases CRT manufacturing costs. Finally, while incorporating a conductive element within the antistatic/antireflective coating by means of ultrasonic spot welding provides a good conductive path from the inner antistatic layer to neutral ground, this approach also increases the complexity of CRT manufacture resulting in a corresponding increase in manufacturing costs.

The present invention addresses the aforementioned limitations of the prior art by providing for the electrical grounding of an inner electrically conductive antistatic layer disposed on the outer surface of a CRT's glass display screen where an outer non-conductive antireflective layer is disposed over the inner antistatic layer. The inner antistatic layer is first deposited on the entire outer surface of the display screen. A portion of the deposited antistatic layer is then masked prior to deposition of the outer antireflective layer leaving a portion of the inner antistatic layer exposed after the antireflective layer is applied. The exposed portion, or portions, of the antistatic layer is then electrically coupled to the CRT's grounded implosion protection band for safely directing electrostatic charge on the display screen to neutral ground.

OBJECTS AND SUMMARY OF THE INVENTION

Accordingly, it is an object of the present invention to deposit an outer insulative antireflective layer on an inner conductive antistatic layer disposed on the outer surface of a CRT display screen, while leaving a portion of the inner antistatic layer exposed to facilitate grounding of the inner antistatic layer and discharge of electrostatic charge buildup on the display screen safely to neutral ground.

A further object of the present invention is to provide apparatus and a method for forming a two-layer coating comprised of a grounded conductive inner antistatic layer and an insulative outer antireflective layer on the outer surface of a video display screen by sputtering.

These objects of the present invention are achieved and the disadvantages of the prior art are overcome by a method and apparatus for applying an antistatic/antireflective coating to an outer surface of a glass display screen of a CRT, wherein a video image is produced on the glass display panel by plural electron beams incident upon a light emitting coating disposed on an inner surface of the glass display screen, and wherein an electrostatic charge is produced on the display screen by the electron beams incident thereon and incident light is reflected by the display screen, the method and apparatus comprising the steps of or means for applying a first electrically conductive antistatic layer by sputtering to the outer surface of the glass display screen; masking a peripheral portion of the first antistatic layer, and applying a second insulative antireflective layer on the first antistatic layer by sputtering, wherein the second antireflective layer is not disposed on the masked portion of the first antistatic layer leaving the masked portion of the first antistatic layer exposed for connection to an electrically grounded conductor for directing electrostatic charge on the display screen to neutral ground.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 7 is a simplified plan view of the combination of an inner antistatic layer and an outer antireflective layer disposed on the outer surface of a CRT glass display screen in accordance with the principles of the present invention; and FIGS. 8a, 8b and 8c are respectively simplified top plan, side elevation and perspective views of a portion of the display screen coating apparatus shown in FIGS. 5 and 6.

DETAILED DESCRIPTION OF THE PREFERRED EMBODIMENTS

Figure 1:
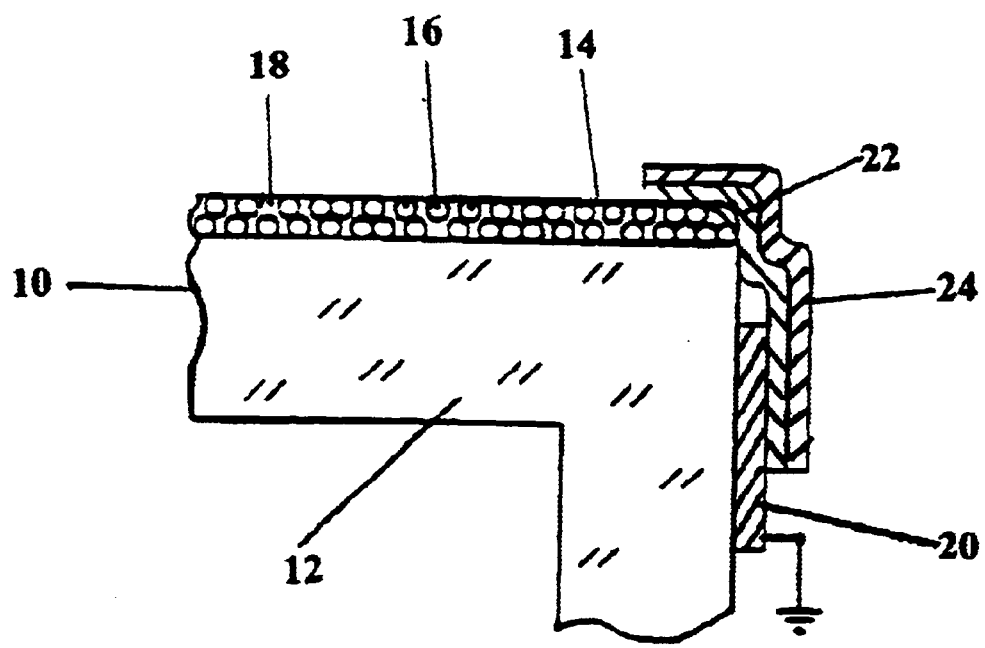
FIG. 1 is a partial sectional view of a portion of a CRT showing details of a prior art grounding arrangement for a composite antistatic/antireflective layer disposed on the outer surface of the CRT's display screen.
Figure 2:
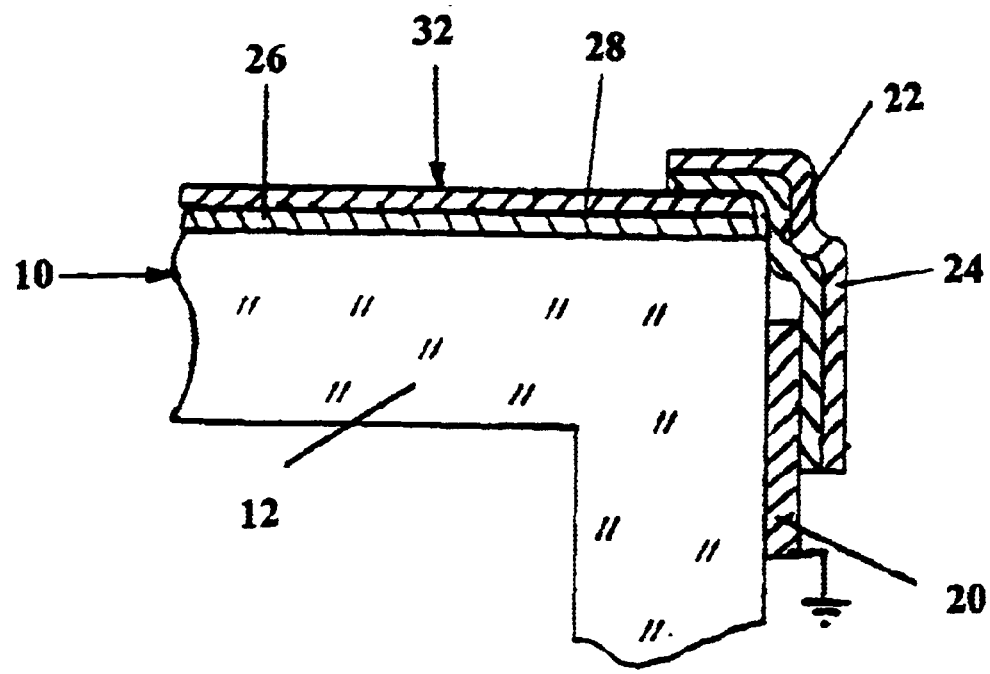
FIG. 2 is a partial sectional view of a portion of a CRT showing details of a prior art grounding arrangement for the combination of an inner antistatic layer and an outer antireflective layer disposed on the outer surface of the CRT's display screen.
Figure 3:
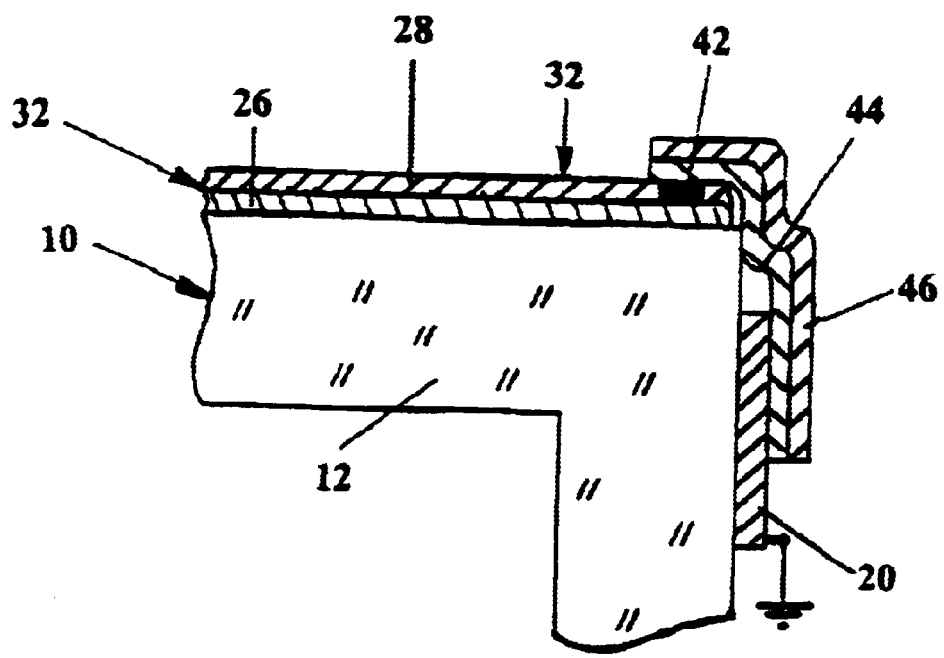
FIG. 3 is a partial sectional view of a portion of a CRT showing details of another embodiment of a prior art grounding arrangement for the combination of an inner antistatic layer and an outer antireflective layer disposed on the outer surface of the CRT's display screen incorporating a conductive element bonded to the inner conductive antistatic layer.
Figure 4:
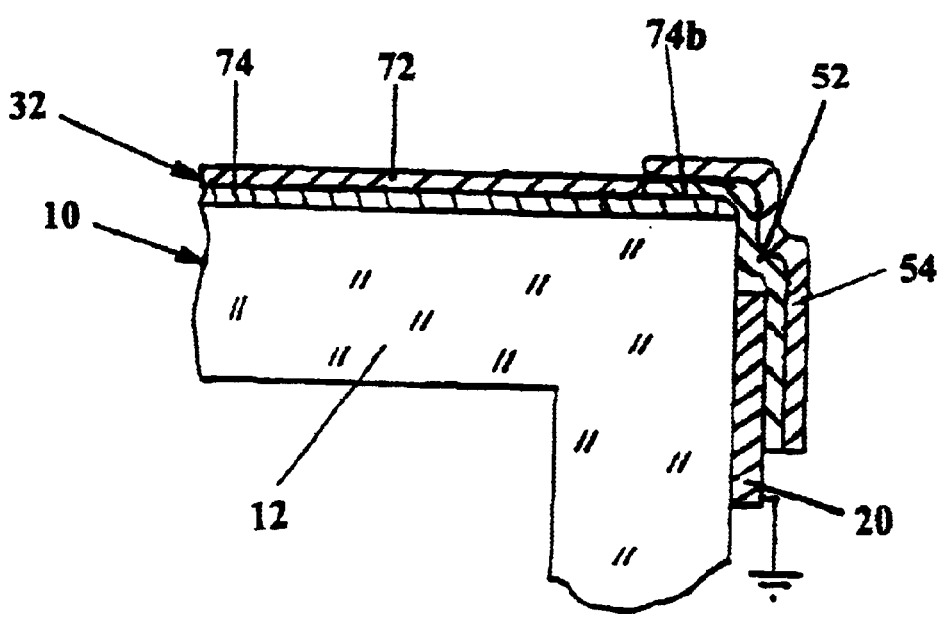
FIG. 4 is a partial sectional view of a portion of a CRT illustrating an electrical grounding arrangement for the combination of an inner antistatic layer and an outer antireflective layer disposed on the outer surface of the CRT's display screen in accordance with the present invention.

Referring to FIG. 4, there is shown an arrangement for grounding the video display screen 12 disposed on the forward portion of a sealed glass envelope 10 of a CRT. Disposed on the outer surface of the glass display screen 12 is the combination of an inner antistatic layer 74 and an outer antireflective layer 72. The inner antistatic layer 74 is first deposited over substantially the entire outer surface of the CRT's glass display screen 12 by sputtering. The outer antireflective layer 72 is then deposited over a substantial portion of the inner antistatic layer 74 by sputtering. This is shown in FIG. 7 which is a simplified plan view of a combination of the outer insulative antireflective layer 72 and a pair of exposed portions 74a and 74b of the inner conductive antistatic layer 74. One of the peripheral exposed edge portions 74b of the inner antistatic layer 74 is also shown in the sectional view of FIG. 4. The pair of exposed peripheral edge portions of 74a and 74b of the first inner antistatic layer 74 are formed by masking the inner antistatic layer prior to depositing the second outer antireflective layer 72 on the inner antistatic layer. A masking, or shielding, arrangement in accordance with this aspect of the present invention is described in detail below. It should be noted that while FIG. 7 shows a pair of exposed peripheral edge portions 74a, 74b of the first inner antistatic layer 74, the present invention is not limited to this configuration as virtually any configuration of an exposed portion, or portions, of the inner antistatic layer 74 may be used for grounding the glass display screen 12 in accordance with the present invention.

As shown in FIG. 4, a conductive Al tape layer 52 is applied to the second exposed peripheral edge portion 74b of the inner antistatic layer 74. The conductive Al tape layer 52 is also placed in contact with the CRT's implosion protection band 20 which is connected to neutral ground. This arrangement provides effective grounding of the inner antistatic layer 74 as well as the CRT's glass display screen 12. A plastic film of conductive Al foil 54 having an inner adhesive layer is positioned in contact with and over the conductive Al tape layer 52 to provide physical protection for the Al tape layer as well as additional electrical conductivity between the inner antistatic layer 74 and the implosion protection band 20.

Figure 5:
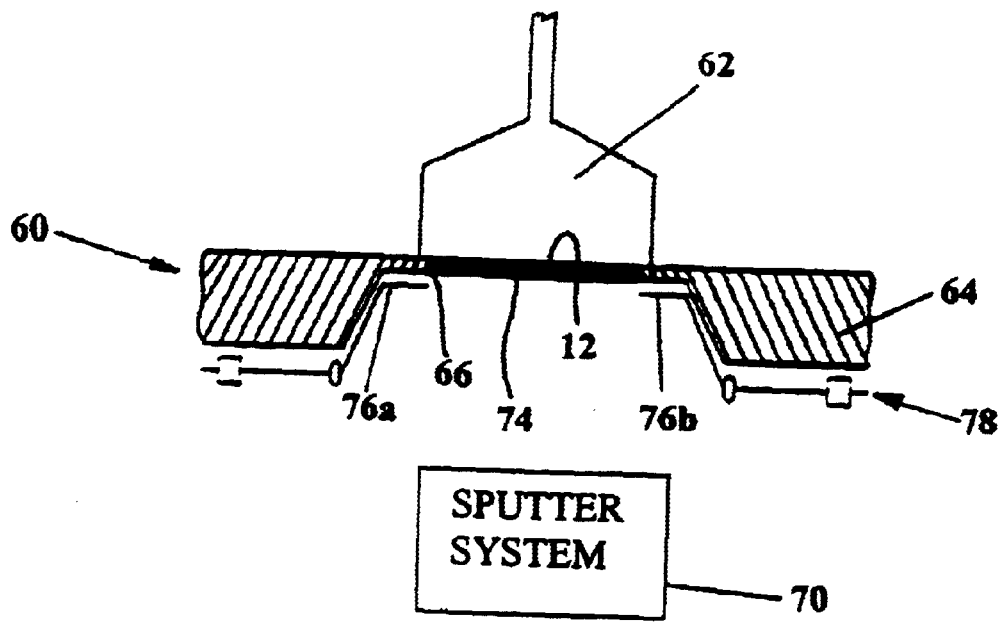
FIGS. 5 and 6 are simplified combined schematic and sectional views of the configuration and operation of a display screen coating apparatus for carrying out the present invention.
Figure 6:
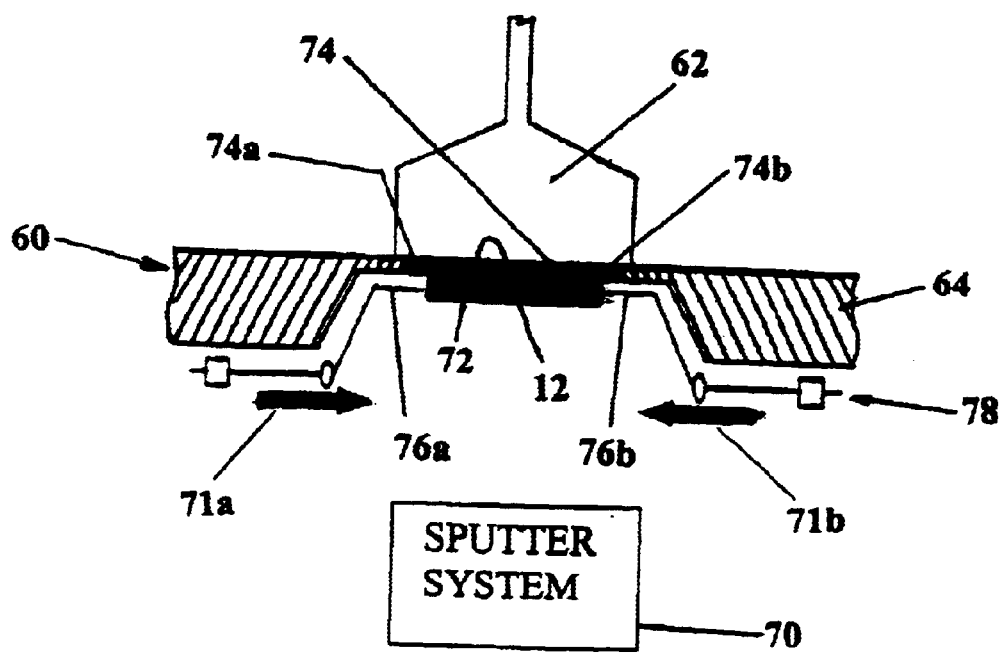

Referring to FIGS. 5 and 6, there are shown simplified combined schematic and sectional views of a coating apparatus 60 for applying the inner antistatic layer 74 and then the outer antireflective layer 72 to the outer surface of the display screen 12 of a CRT 62 in accordance with the present invention. The coating apparatus 60 includes a sputter system 70 for first sputtering the inner antistatic layer 74 and then the outer antireflective layer 72 on the outer surface of the CRT's glass display screen 12. Sputter system 70 may be conventional in design and operation and forms separate antistatic and antireflective layers 74, 72 on the display screen 12. Coating apparatus 60 further includes a CRT support member 64 having an aperture 66 therein. CRT 62 is positioned on the CRT support member 64 over the aperture 66 therein so as to expose the CRT's glass display screen 12 as shown in FIG. 5. Sputter system 70 then applies the first inner antistatic layer 74 to the CRT's glass display screen 12 through the aperture 66 within the CRT support member 64.

The coating apparatus 60 further includes a masking arrangement 78 which includes first and second moveable shields 76a and 76b. Following application of the inner antistatic layer 74 to the outer surface of the CRT's glass display screen 12, the first and second shields 76a, 76b are displaced inwardly along the direction of arrows 71a and 71b, respectively. The first and second shields 76a, 76b are moved inwardly so as to mask, or shield, first and second peripheral edge portions 74a, 74b, respectively, of the first inner antistatic layer 74 as shown in FIG. 6. The second outer antireflective layer 72 is then deposited on the first inner antistatic layer 74 by the sputter system 70 to provide a two-layer antistatic/antireflective coating on the outer surface of the glass display screen 12. Following deposition of the outer antireflective layer 72 on the inner antistatic layer 74, the first and second shields 76a, 76b are displaced outwardly in respective directions opposite to arrows 71a and 71b in preparation for the two layered coating of the next CRT. By positioning the first and second shields 76a, 76b over respective peripheral portions of the inner antistatic layer 74 followed by application of the outer antireflective layer 72 over the inner antistatic layer, the pair of exposed peripheral edge portions 74a, 74b are formed on the inner antistatic layer as shown in FIG. 7 and as described above.

Referring to FIGS. 8a, 8b and 8c, there are respectively shown simplified top plan, side elevation and perspective views of one of the moveable members 80 of the to masking arrangement 78. Moveable member 80 includes the aforementioned shield 76a as well as the combination of a drive mechanism 38 and a displacement guide 40 which may take various forms. For example, drive mechanism 38 may be a motor, while the displacement guide 40 may be a track or rail arrangement for guiding the movement of the first shield 76a.

While particular embodiments of the present invention have been shown and described, it will be obvious to those skilled in the relevant art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for applying an antistatic/antireflective coating to an outer surface of a glass display screen of a CRT, wherein a video image is produced on the glass display panel by plural electron beams incident upon a light emitting coating disposed on an inner surface of said glass display screen, and wherein an electrostatic charge is produced on said display screen by said electron beams incident thereon and incident light is reflected by said display screen, said method comprising the steps of:

applying an electrically conductive antistatic layer by sputtering to the outer surface of the glass display screen;

masking a peripheral portion of said antistatic layer; and applying an insulative antireflective layer on said antistatic layer by sputtering, wherein said antireflective layer is not disposed on the masked portion of said antistatic layer leaving the masked portion of said antistatic layer exposed for connection to an electrically grounded conductor for directing electrostatic charge on the display screen to neutral ground.

2. The method of claim 1 wherein the step of masking a peripheral portion of said antistatic layer includes covering opposed edge portions of said antistatic layer.

3. The method of claim 2 wherein the step of masking a peripheral portion of said antistatic layer includes covering first and second opposed edge portions of said antistatic layer disposed on the outer surface of the glass display screen prior to applying said antireflective layer.

4. The method of claim 1 wherein the step of masking a peripheral portion of said antistatic layer includes positioning a shield between the glass display screen and a sputtering source to prevent deposition of said antireflective layer on a selected portion, or portions, of said antistatic layer.

5. Apparatus for depositing an antistatic/antireflective coating on an outer surface of a glass display screen of a CRT, wherein a video image is produced on the glass display screen by plural electron beams incident upon a light emitting coating disposed on an inner surface of said glass display screen, and wherein an electrostatic charge is produced on said display screen by said electron beams incident thereon and incident light is reflected by said display screen, said apparatus comprising:

a sputtering system for directing an electrically conductive antistatic material onto the outer surface of the glass display screen in forming an inner antistatic layer followed by directing an insulative antireflective material onto said inner antistatic layer in forming an outer antireflective layer; and a masking arrangement disposed adjacent the outer surface of the glass display screen for covering a peripheral portion of said inner antistatic layer prior to directing said insulative antireflective material onto said inner antistatic layer and preventing the directing of said antireflective material onto a portion of said inner antistatic layer in forming an exposed portion of said inner antistatic layer, wherein the exposed portion of said inner antistatic layer is adapted for coupling to a grounded electrical conductor for directing electrostatic charge on the display screen to neutral ground.

6. The apparatus of claim 5 wherein said masking arrangement includes first and second shields moveable between a retracted position wherein each shield is displaced from the glass display screen and in extended position wherein each shield overlies a respective peripheral portion of the display screen.

7. The apparatus of claim 6 wherein said peripheral portions are disposed adjacent opposed lateral edges of the display screen.

8. The apparatus of claim 7 wherein said masking arrangement further includes first and second drive mechanisms for displacing said first and second shields, respectively, between said retracted and extended positions.

* * * * *